United States Patent [19]
Wise et al.

[11] Patent Number: 5,100,479
[45] Date of Patent: Mar. 31, 1992

[54] THERMOPILE INFRARED DETECTOR WITH SEMICONDUCTOR SUPPORTING RIM

[75] Inventors: Kensall D. Wise; Khalil Najafi, both of Ann Arbor, Mich.

[73] Assignee: The Board of Regents acting for and on behalf of the University of Michigan, Ann Arbor, Mich.

[21] Appl. No.: 723,806

[22] Filed: Jul. 1, 1991

Related U.S. Application Data

[62] Division of Ser. No. 586,520, Sep. 21, 1990, Pat. No. 5,059,543.

[51] Int. Cl.⁵ ............................................. H01L 35/28
[52] U.S. Cl. ..................................... 136/225; 136/220; 136/226; 437/3
[58] Field of Search ....................... 136/220, 225, 226; 437/3

[56] References Cited

U.S. PATENT DOCUMENTS

| | | | |
|---|---|---|---|
| 3,354,309 | 11/1967 | Volkovisky | 250/83 |
| 4,111,717 | 9/1978 | Baxter | 437/903 X |
| 4,456,919 | 6/1984 | Tomita et al. | 136/225 X |
| 4,558,342 | 12/1985 | Sclar | 136/225 X |
| 4,897,362 | 1/1990 | Delgado et al. | 437/974 X |
| 4,956,304 | 9/1990 | Cockrum et al. | 437/3 X |
| 4,971,632 | 11/1990 | Rowe | 136/225 X |
| 5,055,140 | 10/1991 | Kumada et al. | 136/225 X |
| 5,059,543 | 10/1991 | Wise et al. | 437/3 |

*Primary Examiner*—Peter A. Nelson
*Attorney, Agent, or Firm*—Bell, Seltzer, Park & Gibson

[57] ABSTRACT

A thermopile detector is disclosed consisting of a semiconductor supporting rim which is doped across all of the rim. The rim supports a series of polycrystalline silicon and metal thermocouples. The fully doped semiconductor area serves as an etch stop for a single-sided etch which eliminates the need for front-to-back alignment of the device. The semiconductor doped rim also serves as a good thermal conductor for supporting the cold junctions. The hot junctions of the thermocouples may be supported by a thin dielectric membrane spanning the device and the cold junctions are formed on the doped rim. The thin dielectric window provides thermal isolation between the semiconductor rim and the center of the window where the hot junctions are located. The thermocouple material layers may be stacked to enable greater thermocouple density on the device. Refractory metals may be employed as the thermocouple metal, to increase sensitivity.

13 Claims, 6 Drawing Sheets

THERMOPILE INFRARED DETECTOR WITH SEMICONDUCTOR SUPPORTING RIM

This application is a divisional of application Ser. No. 07/586,520, filed Sept. 21, 1990, now U.S. Pat. No. 5,059,543.

FIELD OF THE INVENTION

This invention relates generally to infrared detectors and more particularly, to thermopile infrared detectors.

BACKGROUND OF THE INVENTION

Infrared detectors are well known in the electronics art and are required for a variety of applications. These applications include non-contact temperature measurement, in-situ monitoring of semiconductor process steps, infrared spectroscopy, detection of various gases and liquids in industrial process environments, applications in medicine such as medical thermography, and for non-contact thermal imaging of wafers and devices in manufacturing environments.

There are generally two types of infrared detectors—photonic and thermal detectors. In photonic detectors, the radiation is absorbed by the material in the detector resulting in a direct modification of the material's electrical properties. In thermal detectors, radiation is absorbed by the thermal material, causing heating of the lattice of the material. The change in lattice temperature is then converted into change in the electrical properties of the structure. While the two-step transduction process of thermal detectors is generally slower than the single-step process associated with photonic devices, in applications where high speed is not of primary importance, thermal detectors have a number of advantages. These advantages include broad spectral response, low cost, ease of operation, and insensitivity to ambient atmosphere. For applications in gas analyzers, intrusion alarms, non-contact temperature measurement, spectrometers, and other applications, these advantages can be significant.

There are two common types of thermal detectors, known as pyroelectric and thermocouple detectors. In pyroelectric detectors, the temperature change alters the dipole moment of a pyroelectric material, resulting in a charge difference between the crystal faces of the material. A thermocouple consists of a pair of dissimilar conductors so joined at two points that an electromotive force is developed by the thermoelectric effect when the junctions are at different temperatures. A thermocouple requires no bias supply, is useful over a wide range of ambient temperatures, and is easily interfaced with monolithic integrated circuits. To increase the output voltage of a thermocouple-type infrared detector, several thermocouples can be connected in series to form a thermopile.

In the past, thermopile infrared detectors have used vacuum evaporation and shadow masking of the thermocouple materials on thin plastic or alumina substrates, as shown in U.S. Pat. Nos. 4,456,919 and 4,795,498. This approach has resulted in relatively large feature and die sizes and in structures which lack the batch fabrication, process flexibility, and on-chip circuit compatibility characteristic of devices based on the full range of silicon integrated circuit technology.

More recently, the application of silicon semiconductor technology to thermopile detectors has also been implemented. The first silicon thermopile detectors were based on thermocouples of various materials and were shown to be capable of relatively high sensitivity, low cost, room temperature operation, and very wide spectral band response. These detectors often included signal processing circuitry on the same semiconductor substrate as the thermocouples. However, the manufacturing process for these devices required alignment of patterns on both sides of the silicon wafer which increased the die area and the cost of the device. In addition, the structure of the thermocouples in existing silicon thermopile detectors was highly inefficient and, therefore, increased the die area and cost of the device. Finally, existing silicon thermopile detectors have been formed using only a limited number of materials for the thermocouple, which greatly decreases the available materials for the devices and can limit the responsiveness of the device.

Silicon thermopile detectors were considered by Applicant Wise in a 1982 paper entitled "*A Batch-Fabricated Silicon Thermopile Infrared Detector*", 29 IEEE Transactions on Electron Devices 14 (January 1982). A silicon thermopile infrared detector is disclosed, consisting of a series of thermocouples whose hot junctions are supported by a thin silicon membrane and whose cold junctions are formed on a thick supporting rim. The thin silicon membrane was formed by highly doping the intended membrane area with boron. The desired patterns were then defined on the front side of the wafer, for p-diffusion or alignment marks, and on the back side for alignment marks or the membrane opening. The back side pattern had to be aligned with both the crystal axes of the wafer and with the eventual thermopile structure on the front side. Accordingly, the need for front-to-back alignment increased the die area and the device cost. The 1982 publication described thermocouples which were fabricated of interleaved polysilicon and gold layers. Interleaving of the layers increased device size, and the materials involved limited the responsiveness of the device.

Applicant Wise also described silicon thermopile detectors in a 1985 paper entitled "*A Linear Thermopile Infrared Detector Array With On-Chip Multiplexing*" which appeared in Proceedings of the International Conference on Solid-State Sensors and Actuators-Transducers, Philadelphia, PA, June 11-14, 1985. Disclosed is a silicon thermopile detector having a thick boron doped rim in a silicon substrate, which functioned as a heat sink to sustain the cold junctions and give mechanical support to the device. In order to fabricate the device, desired patterns were formed on both the front and back sides of the wafer. The thermocouples were formed of interleaved polysilicon and gold layers on a dielectric layer spanning the rim. The back side of the wafer was etched leaving both the boron-doped areas of the wafer and the undoped areas of the wafer. Again, front-to-back etching alignment was necessary, the interleaved layers increased the detector size, and the thermocouple materials limited responsiveness.

Applicant Wise further considered silicon thermopile detectors in another paper entitled "*A Silicon-Thermopile-Based Infrared Sensing Array for Use in Automated Manufacturing*" which appeared in 33 IEEE Transactions on Electron Devices 72 (January 1986). In that paper Applicant Wise discussed a detector similar to the 1985 detector discussed above. Front and back patterning and alignment was still necessary, and the resulting substrate contained both doped and undoped portions. The thermocouples of these devices were formed of interleaved layers of polycrystalline silicon and gold, thereby increasing device area and reducing sensitivity.

Consequently, even in view of the most recent thermopile detectors, there is still a great need for a thermopile detector which does not require alignment of patterns on both sides of the semiconductor substrate, which has an efficient thermocouple layout, and which can incorporate new materials for the thermocouples to increase sensitivity.

SUMMARY OF THE INVENTION

It is an object of the present invention to provide an improved thermopile detector.

It is another object of the invention to provide a thermopile detector which may be formed in a small die area.

It is yet another object of the present invention to provide a thermopile detector which does not require front-to-back alignment.

It is still another object of the present invention to provide a thermopile detector having high sensitivity.

These and other objects are provided, according to the present invention by a method of fabricating a thermopile detector in which a rim is formed in a semiconductor substrate, with the rim surrounding a first region in the substrate and being surrounded by a second region in the substrate. Thermocouples are then formed on the first region. Then, the semiconductor substrate is etched with an etchant to which the rim is resistant, to thereby dissolve the entire first and second regions. The rim remains intact. Accordingly, the semiconductor substrate except for the rim is dissolved without requiring front-to-back alignment. Preferably, when the substrate is formed of silicon, the rim may be a doped rim, the first and second regions undoped, and the entire substrate may be etched in a solution of ethylenediamine-pyrocatechol (EDP) to dissolve the entire substrate except for the doped rim. Boron is an appropriate dopant for this preferred method.

Alternatively, a lightly doped epitaxial region containing a rim and first and second regions as defined above, may be grown on a heavily doped substrate. The first and second regions are then heavily doped. A preferential etch is then performed which etches the heavily doped regions at a faster rate than the lightly doped regions.

Another alternative employs an epitaxial layer of opposite conductivity type than the substrate The first and second regions of the epitaxial layer are then converted to the substrate's conductivity type while the rim remains of the opposite conductivity type. A preferential etch is performed which etches materials of the substrate's conductivity type faster than materials of the opposite conductivity type. Alternatively, the semiconductor junction thus formed may be biased to create a p-n junction at the rim, with the junction acting as an etch stop.

According to another aspect of the invention, the thermocouples themselves are formed using stacked layers on the first undoped region of the substrate, to thereby increase the density of the thermopile compared to interleaved thermocouples. The stacked thermocouples are preferably formed by forming a first patterned layer, forming an insulating layer on the first patterned layer, and forming a second patterned layer on the insulating layer. Holes may be formed in the insulating layer to allow the first and second patterned layer to contact one another.

According to yet another aspect of the invention, the thermocouples may be formed using polysilicon and a refractory metal such as tantalum. The use of refractory metals is highly compatible with known semiconductor fabrication steps. Refractory metals, especially tantalum, also have a lower thermal conductivity than other metals such as gold, thereby allowing the detector to have higher sensitivity.

A thermopile according to the present invention includes a semiconductor support rim, all of which is doped with a first dopant, with the doped semiconductor rim having an aperture therein. All of the rim is doped with the first dopant because the remaining portions of the semiconductor substrate were removed in the single sided etch step described above. A plurality of thermocouples are formed on the aperture extending onto the semiconductor supporting rim. The thermocouples preferably comprise a patterned polycrystalline silicon layer formed over the aperture extending onto the doped semiconductor supporting rim and a patterned refractory metal layer on the patterned polycrystalline silicon layer. A dielectric layer is formed between the patterned polycrystalline layer and refractory metal layer including a plurality of apertures for allowing the refractory metal layer to contact the polycrystalline layer. The thermopiles are preferably formed on a thin dielectric layer formed across the aperture. The dielectric layer may include a multilayered structure having a silicon nitride layer between two silicon dioxide layers, to provide greater rigidity, control of internal film stress, and thermal compatibility.

In summary, the instant invention provides for a semiconductor thermopile infrared detector which is easy to manufacture and has a high yield compared to prior devices due to the elimination of the need for front-to-back alignment and front side etch. In addition, the die area of the device can be quite small even while carrying a large number of thermocouples due to the stacked structure for the thermocouples. The detector of the present invention also exhibits improved performance due to the large number of thermocouples, the lower thermal conductivity of the refractory metal thermocouple material, and the low thermal capacitance of the dielectric windows.

DETAILED DESCRIPTION OF THE INVENTION

The present invention will now be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art.

Like characters refer to like elements throughout. For greater clarity, the size of the elements has been exaggerated.

Figure 1:
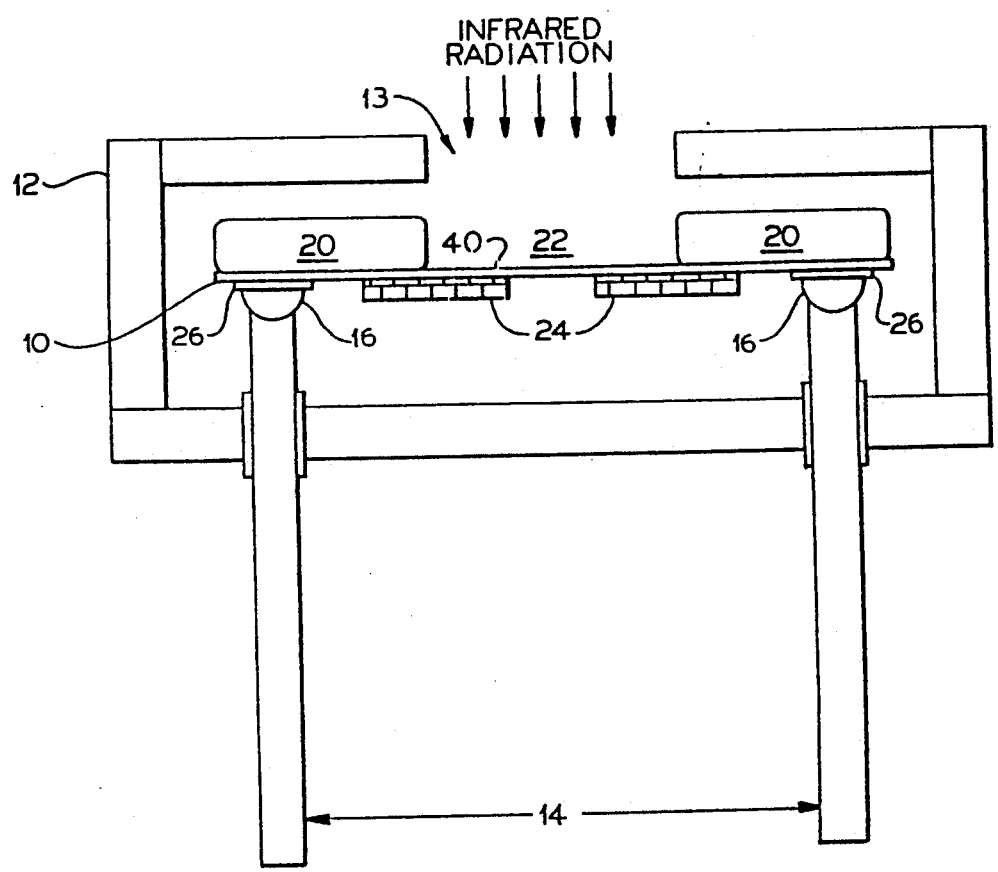
FIG. 1 illustrates a semiconductor thermopile infrared detector of the present invention during operation.

Referring now to FIG. 1 the semiconductor thermopile infrared detector is shown in operation. The semiconductor thermopile infrared detector 10 is shown inside a casing 12 which is typically formed of metal. Output leads 14 are connected to output pads 26 of the detector 10 at bonding regions 16 using solder or other well known bonding materials. The output leads 14 typically connect the detector 10 to processing circuitry. A window 13 in casing 12 allows infrared radiation to strike thermopiles 24 through a dielectric membrane 40 formed in aperture 22 of the boron-doped semiconductor rim 20, as described in detail below.

Figure 2A:
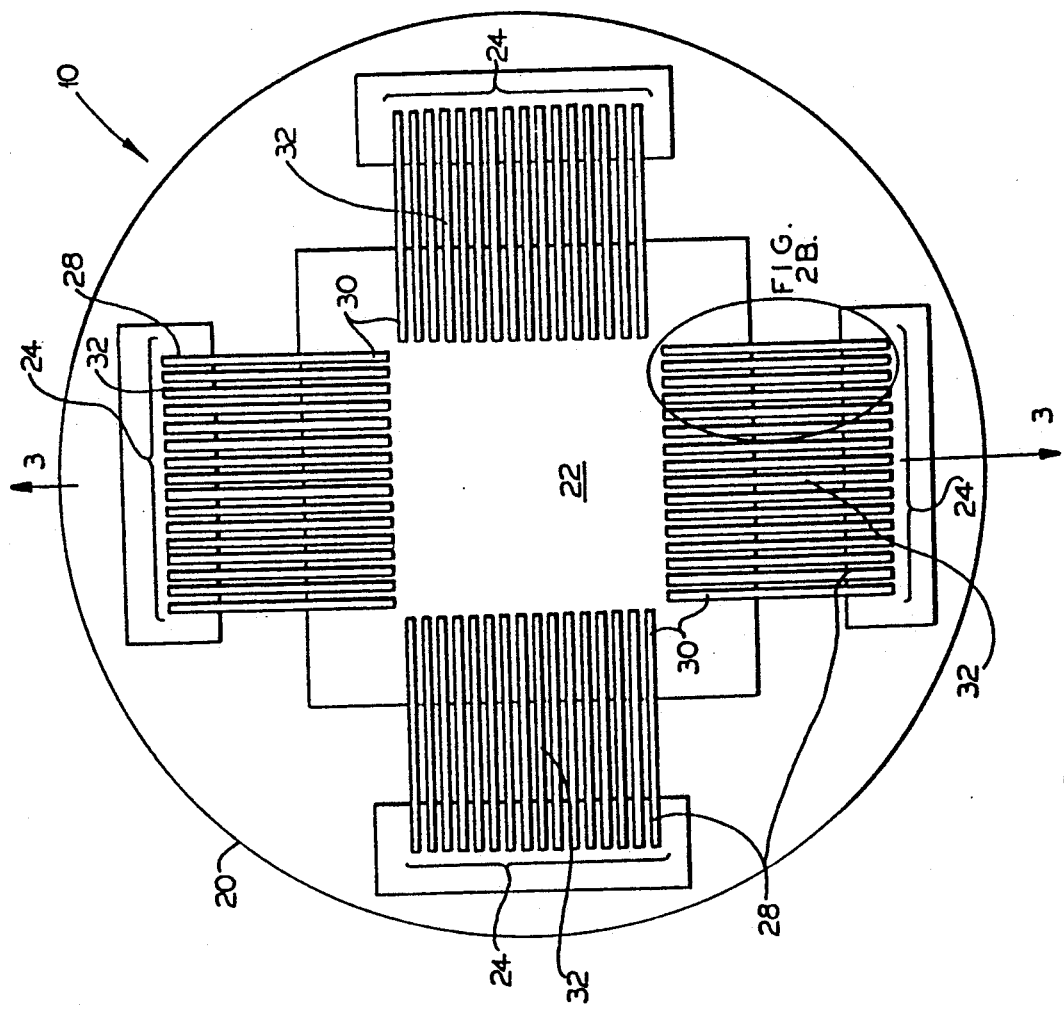
FIGS. 2A and 2B illustrate a silicon thermopile infrared detector of the present invention with a detailed view of one embodiment of the thermocouple layer structure of the present invention.

Referring now to FIG. 2A, a top view of the semiconductor thermopile infrared detector 10 is shown. The detector 10 consists of a thick semiconductor rim 20 containing an aperture 22. The aperture 22 functions as the window through which the infrared radiation is detected. Thermopiles 24 span portions of the aperture 22 and the rim 20. The thermopiles 24 are formed of a plurality of thermocouples 32. The thermopiles 24 are connected to the output leads and processing circuitry through output pads 26 shown in FIG. 2(b). The cold junctions 28 of the thermocouples are positioned over the semiconductor rim 20 and the hot junctions 30 are positioned over the aperture 22. A typical detector of the present invention, similar to FIG. 2A, may include 80 thermocouples divided between four thermopiles on an aperture area of 1.5 mm×1.5 mm. Each thermocouple may be approximately 600 $\mu$m long and have a pitch of 30 $\mu$m.

Figure 2B:
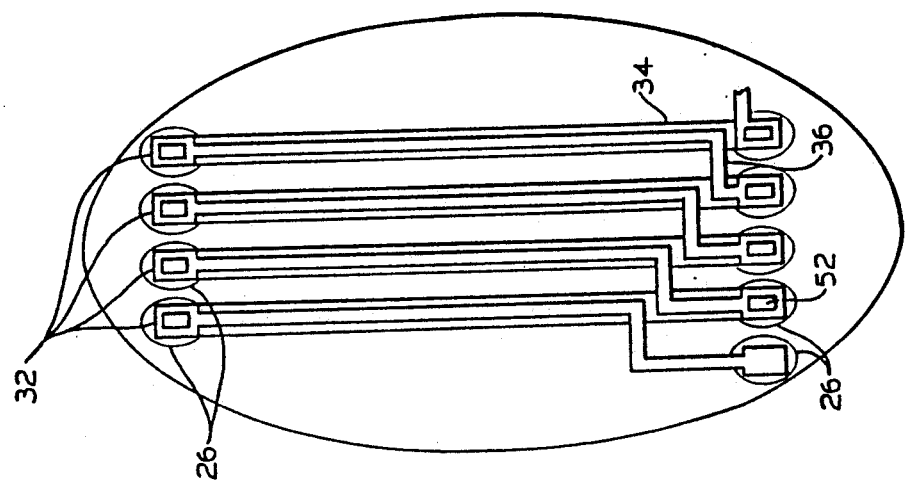

An enlarged view of one embodiment of the thermocouples 32 is shown in FIG. 2(b). In this embodiment, the thermocouple layers are deposited over one another. This stacked structure allows the number of thermocouples per device to be increased. Each thermocouple comprises a patterned polysilicon layer 34 and a metal layer 36 running over at least part of the polycrystalline silicon layer 34. A dielectric layer (not shown) may insulate the metal and polycrystalline silicon layers. Contact holes 52 allow the metal and polycrystalline silicon layers to electrically contact one another to form the thermocouple. Other views of the stacked thermocouple layers can be seen in FIGS. 3 and 4.

Figure 3:
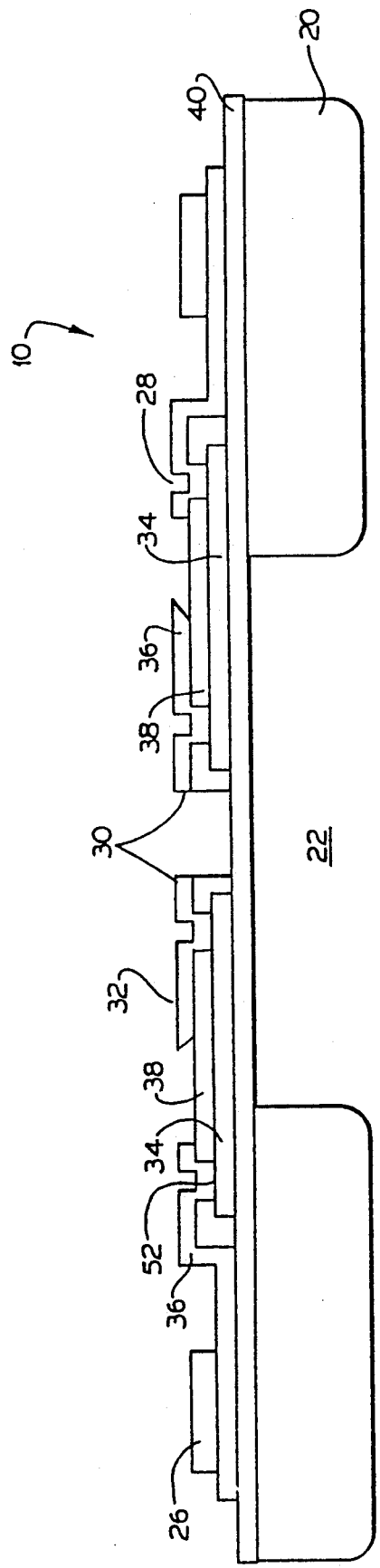
FIG. 3 illustrates a cross section of a semiconductor thermopile infrared detector of the present invention across line 3—3 of FIG. 2A.

FIG. 3 is a cross section of the device shown in FIG. 2A taken along line 3—3 of FIG. 2A. The thick semiconductor rim 20 of the semiconductor thermopile infrared detector 10 supports the thermocouples 32 which span the aperture 22. The thermocouples are formed of a first layer of polycrystalline silicon 34 and a metal layer 36. The polycrystalline silicon 34 and metal 36 may be separated by an insulator layer 38. The insulator is typically silicon oxide. The polycrystalline layer 34 and metal layer 36 electrically contact one another through contact holes 52 in insulating layer 38. The aperture 22 is preferably spanned by a dielectric diaphragm 40 to support the thermopile. Alternatively, the thermopile may be self-supporting. The hot junctions 30 are formed over the aperture 22 while the cold junctions 28 are formed over the semiconductor support rim 20. Output pads 26 may be formed on metal layer 36. The aperture 22 area spanned by the dielectric is coated with a thin film of bismuth oxide or carbon black during packaging so that the area also absorbs incident radiation, thereby enhancing the sensitivity of the device.

Figure 4A:
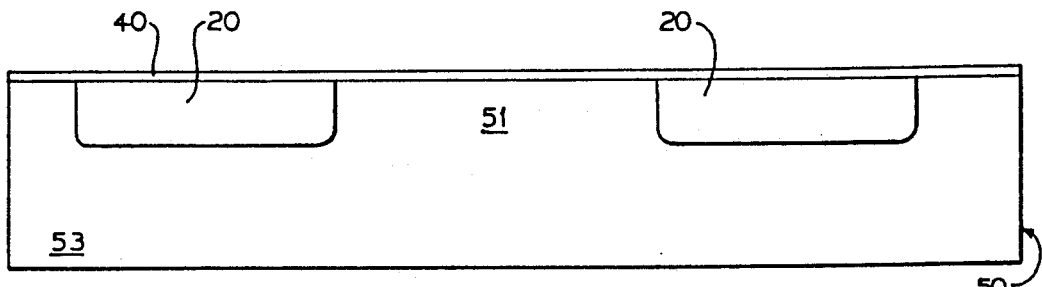
FIGS. 4A–4F illustrate the steps of a method of forming a semiconductor thermopile infrared detector of the present invention.

Referring now to FIGS. 4A-4F, a method of fabricating a semiconductor thermopile infrared detector is shown. In FIG. 4A semiconductor substrate 50 is heavily doped in area 20 to form a rim. Doped area 20 is typically formed in a toroid shape. The doped area 20 surrounds a first undoped region 51 in the substrate and is surrounded by a second undoped region 53 in the substrate. Those skilled in the art will recognize that the "undoped" region 53 may of necessity be lightly doped with some impurity which is not of a type or concentration to result in an etch stop. The semiconductor substrate may be monocrystalline silicon, germanium, gallium arsenide or other semiconductors. Typically boron doping is used with a silicon substrate.

In order to dope the semiconductor substrate 50, the substrate 50 may be thermally oxidized to grow a 1 $\mu$m of silicon oxide. The oxide is patterned in the shape of the intended rim. If the substrate 50 is silicon and the dopant used is boron, the wafer is subjected to a deep boron diffusion for 15 hours at 1175° C. to form the heavily boron-doped rim 20 having a thickness of approximately 15 $\mu$m. The temperature and time of the diffusion set the thickness of the rim, which can be from 1 to 20 $\mu$m. Next, the substrate 50 is subjected to a short wet oxidation in a steam ambient for approximately 20 minutes at about 1100° C. to dilute the borosilicate glass which may be formed during the deep boron diffusion. The substrate 50 is then subjected to an unmasked etch in a buffered hydrofluoric acid to remove the oxide on the substrate.

Next, as seen in FIG. 4A, if a dielectric diaphragm 40 is to be employed in the device such a dielectric is deposited. The dielectric may be formed by growing a thermal silicon dioxide layer of 1500 Å on the substrate 50. Then thin films of silicon nitride and silicon dioxide of 2500 Å and 6000 Å, respectively, are deposited on the substrate 50 using low pressure chemical vapor deposition. This multi-layer dielectric forms a thin diaphragm and results in a structure with reduced stress after the detectors are etched free from the semiconductor substrate 50. The oxide in the oxide-nitride-oxide is normally in compressive stress on silicon at room temperature whereas the nitride is in tensile stress. By adjusting the relative thickness of these layers, the overall stress of the composite dielectric may be adjusted to be in mild tension which is desirable to avoid mechanical flexing of the membrane in response to ambient temperature changes.

Figure 4B:
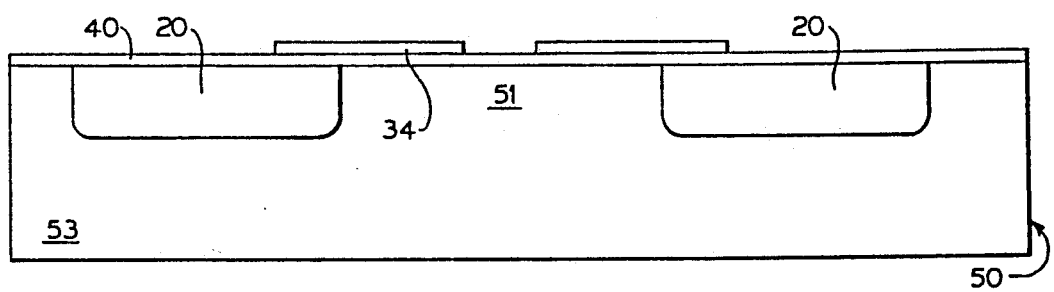

Referring now to FIG. 4B, a layer of polycrystalline silicon 34 is formed on the dielectric layer 40. The polycrystalline silicon layer 34 for each thermopile 24 is preferably formed so as to span at least a portion of both the doped semiconductor area 20 and the undoped area 51 of semiconductor substrate 50. If the dielectric diaphragm layer 40 is not used the polycrystalline silicon layer 34 or the insulator layer 38 should span at least portions of both the doped area 20 and the undoped area 51 in order to provide support for the device after etching. The polycrystalline silicon layer is typically 8000 Å thick. The polycrystalline silicon layer may be doped with either phosphorous, boron, arsenic or other common silicon dopants using diffusion or ion implantation to the desired concentration. Typically, a concentration of $10^{17}$ cm$^{-1}$ is used. The doping of the polycrystalline silicon layer 34 enhances its electrical conductivity. The polycrystalline silicon layer 34 is then patterned to form the lower thermocouple material.

Figure 4C:
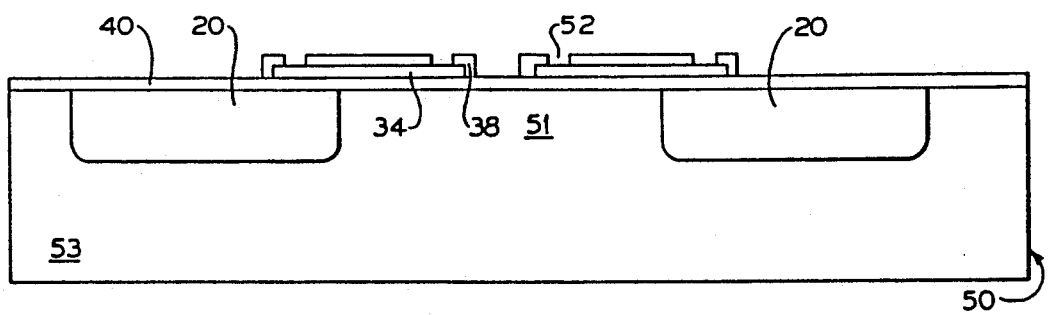

Next, as seen in FIG. 4C, a thin layer of silicon dioxide 38 may be formed on the polycrystalline silicon 34. The silicon dioxide may be approximately 3000 Å thick and may be deposited using low pressure chemical vapor deposition. Contact holes 52 are then opened to the polycrystalline silicon layer 34.

Figure 4D:
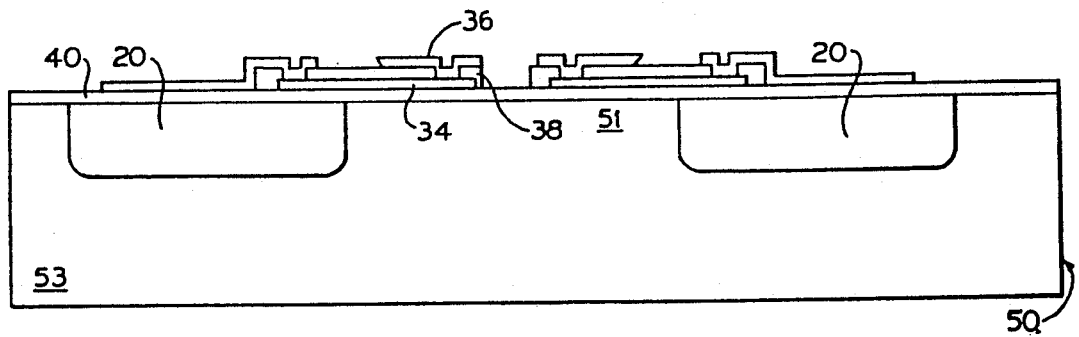

Referring now to FIG. 4D, the upper thermocouple layer 36 is formed on the insulator layer 38 filling the contact holes 52 with the upper thermocouple layer material. As shown, the upper thermocouple layer 36 is formed over the lower thermocouple material 34. This stacked structure allows for increased number of thermocouples per device. A refractory metal is preferably used for the upper thermocouple layer 36. Refractory metals generally have lower thermal conductivity than other metals, such as gold. Consequently, use of a refractory metal in the instant detector can lead to increased device responsiveness because the increased thermal resistance between the hot junctions and the doped rim results in a greater temperature rise for a given radiant input power. Tantalum is the preferred refractory metal for the upper thermocouple layer 36. The refractory metal layer may be sputtered onto the wafer and patterned to form the second thermocouple layer. Before the upper thermocouple layer deposition, the polycrystalline silicon surface 34 may have any native silicon dioxide formed on the polycrystalline silicon in the contact holes 52 removed by sputter etching or another known method. The refractory metal can be patterned using a lift off process, by etching the refractory metal using reactive ion beam etching, or by other known techniques.

Figure 4E:
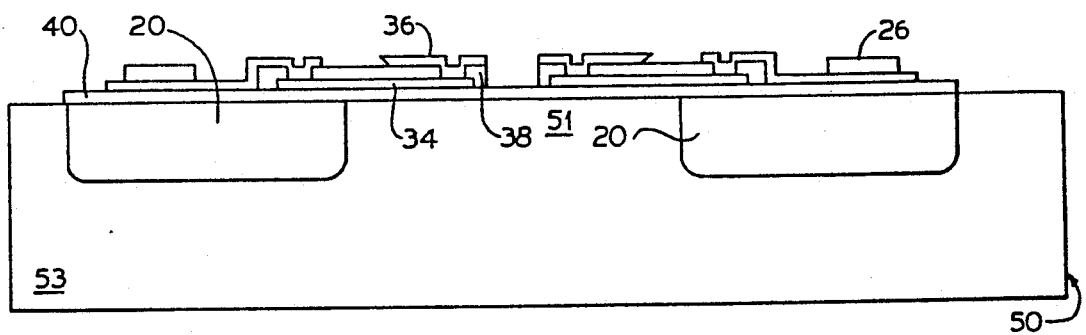
Figure 4F:
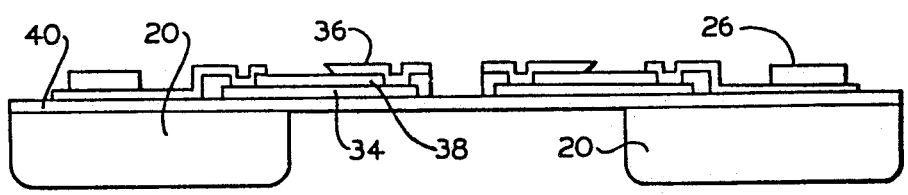

Referring now to FIG. 4E, output pads 26 may be formed on the upper thermocouple layer 36. Preferably gold output pads are used. These gold output pads 26 may be formed by depositing 200 Å of chromium followed by 2000 to 3000 Å of gold either by electron beam evaporation or sputtering. The gold is then patterned to form the output pads. As also shown in FIG. 4E, the portions of the dielectric layer 40 outside of the detector area are etched. Preferably a dry plasma etching technique is used. Finally, as shown in FIG. 4F, the semiconductor substrate 50 is subjected to an unmasked etch which etches away the first undoped area 51 and the second undoped area 53 of substrate 50, but does not attack the doped rim 20 or any of the other thin films formed on the front side of the device. When the semiconductor substrate 50 is silicon and the doped area 20 is boron-doped, an ethylenediamine-pyrocatechol (EDP) and water etch is preferred. Thus, the etch is self-stopping and does not involve any critical steps or controls No front-to-back alignment is necessary. After etching, the semiconductor thermopile detectors can be recovered from the solution, rinsed and are ready for mounting and testing.

Figure 5:
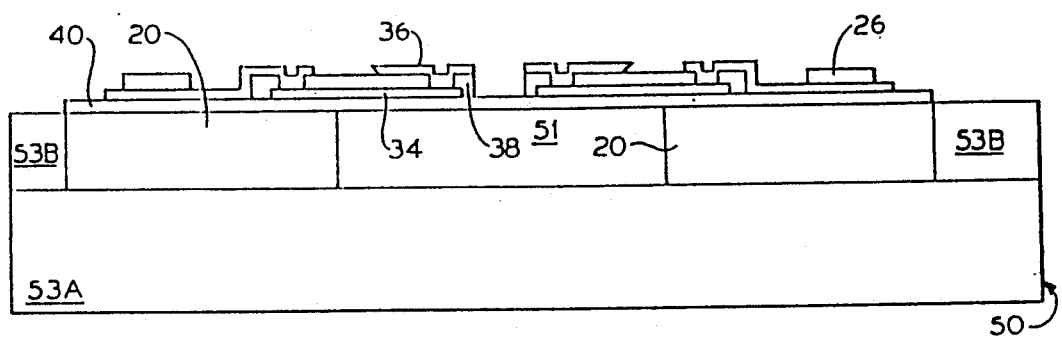
FIG. 5 illustrates a step, corresponding to the step of FIG. 4E, of an alternative method of forming a semiconductor thermopile infrared detector of the present invention.

Referring now to FIG. 5, alternative methods of forming a semiconductor thermopile detector are shown. The structure illustrated in FIG. 5 corresponds to the structure of FIG. 4E. However, in FIG. 5, second region 53 is formed of two regions 53A and 53B. These two regions may be etched without attacking the rim 20 as described below.

As seen in FIG. 5, a lightly-doped epitaxial region may be grown on a heavily doped substrate 53A of the same type (n- or p-type with a doping level above $10^{18}$ atoms/cc). Diffusion may be used to heavily dope areas 51 and 53B of the epitaxial layer. A preferential etch that attacks the heavily-doped areas 53A, 53B, and 51 at a much faster rate than lightly-doped area 20 could then be used to form the rim. One etch used to accomplish this is an 8:3:1 mixture of acetic, nitric, and hydrofluoric acid. A disadvantage of this approach as compared with the diffused boron etch-stop (FIG. 4E) is that the selectivity of the etch is lower in the 8:3:1 etch than with the boron process. However, this method does have the advantage that the lightly-doped epitaxial rim 20 would be more suitable for the integration of electronic devices and circuits than the highly-doped boron layer.

Another alternative is to employ an epitaxial layer of the opposite conductivity type from the substrate 53A and then diffuse the epitaxial layer to convert areas 53B and 51 to the same type as the substrate 53A. A p-n junction is thereby formed surrounding rim 20. By applying the bias across the p-n junction defining the rim 20, etchants such as ethylenediamine-pyrocatechol can be made to stop on the p-n junction defining the rim. While the selectivity of this method is high and circuitry may be formed in the resulting rim, it is more complex to implement this electrochemical etch-stop than the boron etch-stop.

In summary, a semiconductor infrared thermopile detector is disclosed which eliminates the need for front-to-back alignment of the semiconductor substrate. In addition, the stacked thermocouples allow for high thermocouple density on the die while allowing the die area to remain small. Refractory metals are used as thermocouple material in order to increase device responsiveness. Thus, a more responsive, high yield, and easily fabricated semiconductor thermopile infrared detector is provided.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A thermopile comprising:
   a semiconductor supporting rim, all of said semiconductor supporting rim being doped with a first dopant, said doped semiconductor supporting rim having an aperture therein; and
   a plurality of thermocouples in said aperture, extending onto said doped semiconductor supporting rim.

2. The thermopile of claim 1 wherein said plurality of thermocouples comprises:
   a patterned polycrystalline silicon layer formed over said aperture, extending onto said doped semiconductor supporting rim; and
   a patterned refractory metal layer on said patterned polycrystalline silicon layer.

3. The thermopile of claim 1 wherein the plurality of thermocouples further comprises a dielectric layer between said patterned polycrystalline layer and said refractory metal layer, said dielectric layer including a plurality of apertures, said refractory metal layer contacting said polycrystalline layer through said plurality of apertures.

4. The thermopile of claim 2 wherein said refractory metal layer comprises tantalum.

5. The thermopile of claim 1 wherein said semiconductor supporting rim comprises silicon and wherein said first dopant comprises boron.

6. The thermopile of claim 1 wherein said semiconductor supporting rim comprises a toroid-shaped semiconductor supporting rim.

7. A thermopile comprising:
- a silicon supporting rim, all of said silicon supporting rim being doped with boron, said doped silicon supporting rim having an aperture therein;
- a dielectric membrane formed on said silicon supporting rim and spanning said aperture;
- a patterned polycrystalline silicon layer formed over said aperture on said dielectric membrane, extending onto said boron-doped silicon supporting rim; and
- a patterned refractory metal layer on said patterned polycrystalline silicon layer.

8. The thermopile of claim 7 wherein said silicon supporting rim comprises a toroid-shaped silicon supporting rim.

9. The thermopile of claim 7 wherein said refractory metal is tantalum.

10. A thermopile comprising:
- a silicon supporting rim having an aperture therein;
- a dielectric membrane formed on said supporting rim and spanning said aperture;
- a patterned polycrystalline silicon layer formed over said aperture on said dielectric membrane, extending onto said supporting rim; and
- a patterned refractory metal layer on said patterned polycrystalline silicon layer.

11. The thermopile of claim 10 wherein said supporting rim comprises a toroid-shaped silicon supporting rim.

12. The thermopile of claim 10 wherein said refractory metal is tantalum.

13. The thermopile of claim 10 further comprising a dielectric layer between said patterned polycrystalline layer and said patterned refractory metal layer, said dielectric layer including a plurality of apertures, said patterned refractory metal layer contacting said patterned polycrystalline layer through said plurality of apertures.

* * * * *

UNITED STATES PATENT AND TRADEMARK OFFICE
CERTIFICATE OF CORRECTION

PATENT NO. : 5,100,479

DATED : March 31, 1992

INVENTOR(S) : Wise et al.

It is certified that error appears in the above-identified patent and that said Letters Patent is hereby corrected as shown below:

Column 7, line 7, "$cm^{-1}$" should be --$cm^{-3}$--

Signed and Sealed this

Third Day of August, 1993

Attest:

MICHAEL K. KIRK

Attesting Officer

Acting Commissioner of Patents and Trademarks